(12) United States Patent
Son et al.

(10) Patent No.: US 11,963,418 B2
(45) Date of Patent: Apr. 16, 2024

(54) DISPLAY DEVICE

(71) Applicant: Samsung Display Co., Ltd., Yongin-Si (KR)

(72) Inventors: Sunkwun Son, Suwon-si (KR); Dong Hee Shin, Asan-si (KR); Nahyeon Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 338 days.

(21) Appl. No.: 17/232,043

(22) Filed: Apr. 15, 2021

(65) Prior Publication Data

US 2022/0077278 A1    Mar. 10, 2022

(30) Foreign Application Priority Data

Sep. 4, 2020    (KR) ........................ 10-2020-0113277

(51) Int. Cl.
| | |
|---|---|
| *H10K 59/18* | (2023.01) |
| *G09G 3/20* | (2006.01) |
| *H01L 23/60* | (2006.01) |
| *H10K 59/131* | (2023.01) |
| *H10K 59/88* | (2023.01) |

(52) U.S. Cl.
CPC .......... *H10K 59/18* (2023.02); *G09G 3/2003* (2013.01); *H01L 23/60* (2013.01); *H10K 59/131* (2023.02); *H10K 59/88* (2023.02); *G09G 2300/026* (2013.01); *G09G 2300/0426* (2013.01); *G09G 2330/04* (2013.01)

(58) Field of Classification Search
CPC ........... G02F 1/13336; G02F 1/136204; G02F 1/136286–136295; H01L 27/124; H01L 27/1244; H01L 27/3276; H01L 27/3279; H01L 23/60; H10K 59/18; H10K 59/19; H10K 59/131; H10K 59/1315; G09G 2330/04; G09G 3/3208; G09G 2300/026
See application file for complete search history.

(56) References Cited

U.S. PATENT DOCUMENTS

| | | | |
|---|---|---|---|
| 10,636,859 B2* | 4/2020 | Park ................... | H10K 59/1216 |
| 2011/0085100 A1* | 4/2011 | Kim .................. | G02F 1/134363 |
| | | | 445/24 |
| 2012/0140160 A1* | 6/2012 | Han ..................... | G02F 1/13336 |
| | | | 349/144 |
| 2018/0101073 A1* | 4/2018 | Bae .......................... | G09G 3/20 |
| 2020/0235172 A1* | 7/2020 | Lee ........................ | H10K 50/15 |

FOREIGN PATENT DOCUMENTS

KR    10-2019-0113535 A    10/2019

* cited by examiner

*Primary Examiner* — Walter H Swanson
*Assistant Examiner* — Jacob T Nelson
(74) *Attorney, Agent, or Firm* — Innovation Counsel LLP

(57) ABSTRACT

A display device according to an embodiment may include a first sub-display panel and a second sub-display panel adjacent to the first sub-display panel in a first direction. The first sub-display panel may include a first pixel adjacent to the second sub-display panel and a first ground line disposed between the first pixel and the second sub-display panel and extending in a second direction crossing the first direction. The second sub-display panel may include a second pixel adjacent to the first sub-display panel and a second ground line disposed between the second pixel and the first sub-display panel and extending in the second direction.

20 Claims, 13 Drawing Sheets

DISPLAY DEVICE

CROSS-REFERENCE TO RELATED APPLICATION

This application claims priority from and the benefit of Korean Patent Application No. 10-2020-0113277, filed on Sep. 4, 2020, which is hereby incorporated by reference for all purposes as if fully set forth herein.

BACKGROUND

1. Field

The present disclosure relates to a display device. More particularly, the present disclosure relates to a display device including a plurality of sub-display panels.

2. Discussion of the Background

Flat panel display devices are replacing cathode ray tube display devices as display devices due to their lightweight and thin characteristics. As representative examples of such flat panel display devices, there are liquid crystal display devices and organic light emitting diode display devices.

Recently, a tiled display device that combines at least two sub-display panels to implement a large display panel has been developed. In a process of manufacturing the tiled display device, static electricity may be generated in each of the sub-display panels. Accordingly, a reliability of the tiled display device may be reduced. In addition, as a seam line between two sub-display panels adjacent to each other may be visually recognized by a viewer, a display quality of the tiled display device may be reduced.

SUMMARY

Embodiments of the present inventive concept provide a display device with improved reliability.

Embodiments of the present inventive concept also provide a display device with improved display quality.

Additional features of the inventive concepts will be set forth in the description which follows.

A display device according to an embodiment may include a first sub-display panel and a second sub-display panel adjacent to the first sub-display panel in a first direction. The first sub-display panel may include a first pixel adjacent to the second sub-display panel and a first ground line disposed between the first pixel and the second sub-display panel and extending in a second direction crossing the first direction. The second sub-display panel may include a second pixel adjacent to the first sub-display panel and a second ground line disposed between the second pixel and the first sub-display panel and extending in the second direction.

According to an embodiment, the first ground line and the second ground line may be adjacent to each other.

According to an embodiment, the display device may further include a third sub-display panel adjacent to the first sub-display panel in the second direction. The first sub-display panel further may include a third ground line disposed between the first pixel and the third sub-display panel and extending in the first direction.

According to an embodiment, the first pixel may be adjacent to the third sub-display panel.

According to an embodiment, the first ground line and the third ground line may be perpendicular to each other.

According to an embodiment, a portion of the first ground line may overlap a portion of the third ground line.

According to an embodiment, the first and third ground lines may be electrically connected through a contact hole at a portion where the first and third ground lines overlap each other.

According to an embodiment, the first sub-display panel further may include a gate line extending in the first direction and electrically connected to the first pixel.

According to an embodiment, the first ground line may cross the gate line.

According to an embodiment, the first sub-display panel may further include a third pixel adjacent to the first pixel, spaced apart from the second sub-display panel by the first pixel, and electrically connected to the gate line, and a dummy line disposed between the first pixel and the third pixel and extending in the second direction.

According to an embodiment, the dummy line may cross the gate line.

According to an embodiment, the dummy line may include a same material as the first ground line.

According to an embodiment, the first sub-display panel may further include a fourth pixel spaced apart from the first pixel in a third direction opposite to the first direction and electrically connected to the gate line, and a connection line disposed between the first pixel and the fourth pixel, extending in the second direction, and electrically connected to the gate line.

According to an embodiment, the connection line may include a same material as the first ground line.

According to an embodiment, the first sub-display panel may further include a substrate, a first insulating layer disposed on the substrate, a gate electrode disposed on the first insulating layer, a second insulating layer covering the gate electrode, and a connection electrode disposed on the second insulating layer. The first ground line and the connection electrode may be disposed in a first ground-line layer.

According to an embodiment, the third ground line and the gate electrode may be disposed in a third ground-line layer.

According to an embodiment, the gate line and the gate electrode may be disposed in a gate-line layer.

According to an embodiment, the first ground line may contact the second ground line.

According to an embodiment, the first ground line may be spaced apart from the second ground line.

According to an embodiment, the first and second ground lines may protect the first and second pixels from static electricity.

The display device according to embodiments may include the sub-display panels in which ground lines are disposed at edges. Accordingly, it is possible to prevent or reduce static electricity from introducing into each of the sub-display panels. Accordingly, the reliability of the display device may be improved.

The display device according to embodiments, some of the dummy lines included in each of the sub-display panels may be used as the ground line. Accordingly, even if the ground line is disposed, the seam line between two sub display panels adjacent to each other may not be visually recognized. Accordingly, the display quality of the display device may be improved.

BRIEF DESCRIPTION OF THE DRAWINGS

The accompanying drawings illustrate embodiments of the present disclosure.

DETAILED DESCRIPTION

Embodiments of the present disclosure will be understood from the following detailed description in conjunction with the accompanying drawings.

Figure 1:
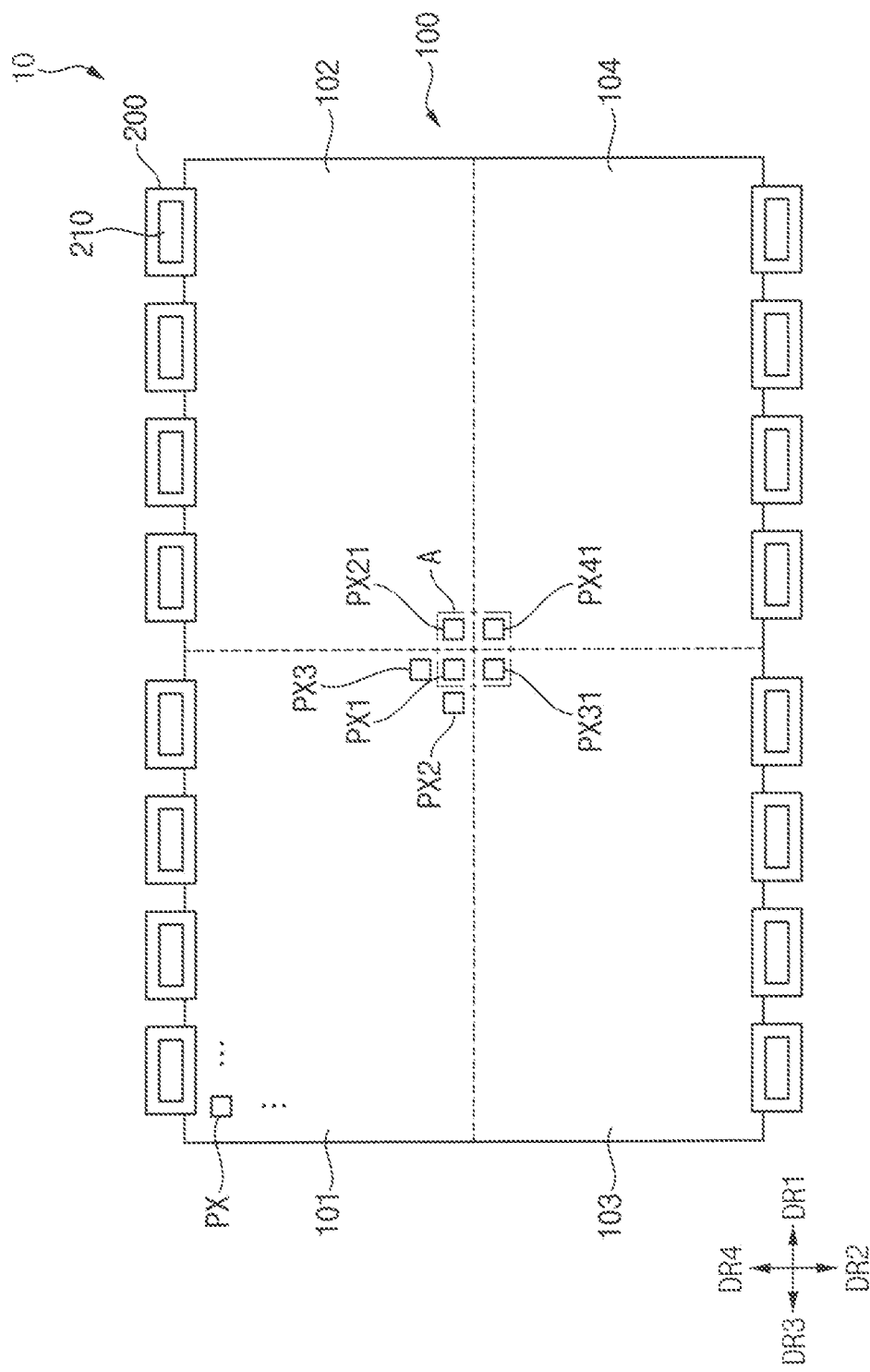
FIG. 1 is a plan view illustrating a display device according to an embodiment.
Figure 2:
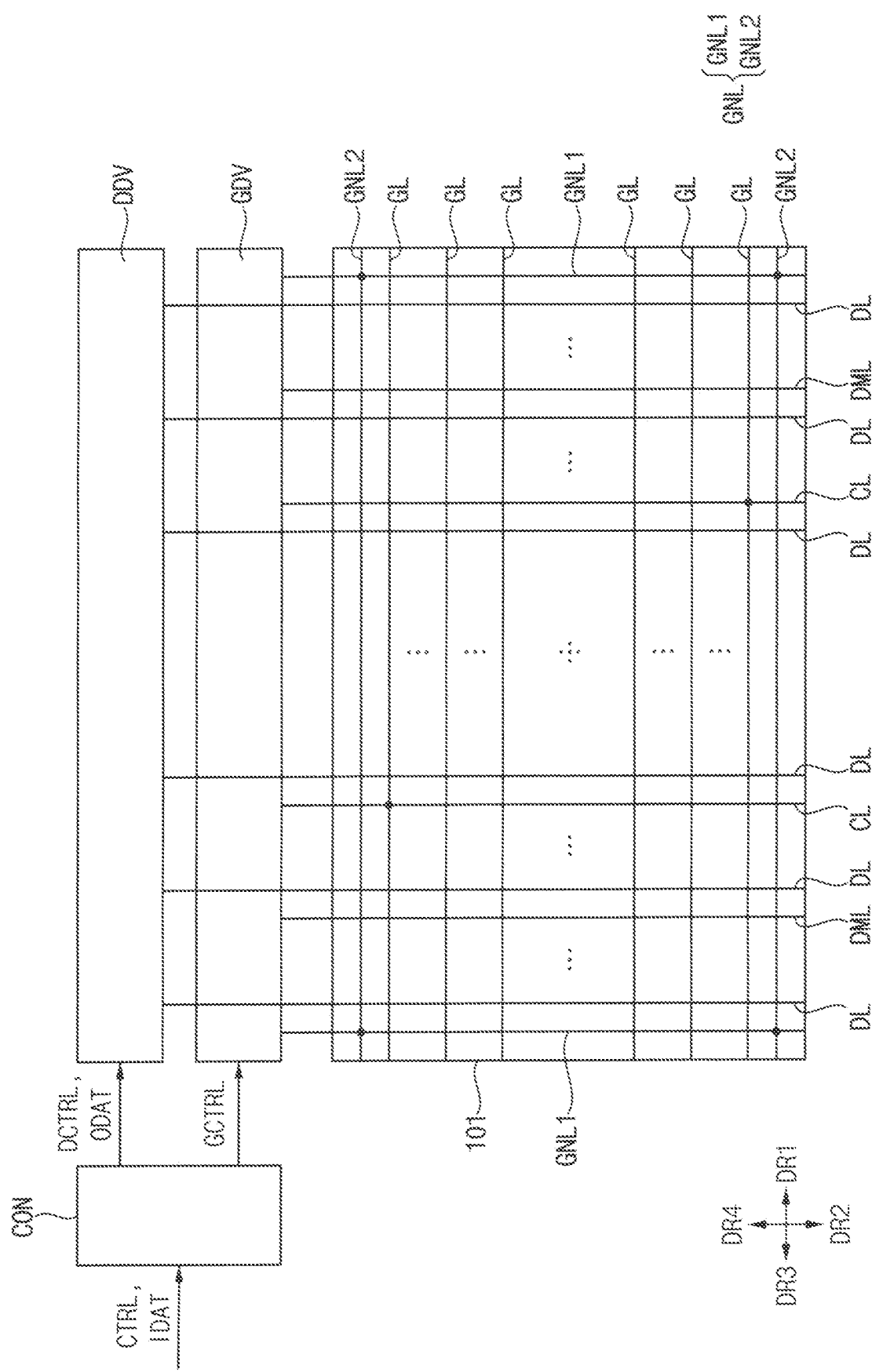
FIG. 2 is a block diagram illustrating driving of a first sub-display panel included in the display device of FIG. 1.

FIG. 1 is a plan view illustrating a display device 10 according to an embodiment. FIG. 2 is a block diagram illustrating driving of a first sub-display panel included in the display device of FIG. 1.

Referring to FIGS. 1 and 2, the display device 10 may include a display panel 100 and a panel driver. The panel driver may include a driving controller CON, a gate driver GDV, and a data driver DDV.

In an embodiment, the display panel 100 may be a tiled display panel including a plurality of sub-display panels. For example, as illustrated in FIG. 1, the display panel 100 may include first to fourth sub-display panels 101, 102, 103 and 104 arranged in a matrix form. That is, the second sub-display panel 102 may be adjacent to the first sub-display panel 101 in a first direction DR1. The third sub-display panel 103 may be adjacent to the first sub-display panel 101 in a second direction DR2 crossing the first direction DR1. For example, the second direction DR2 may be perpendicular to the first direction DR1. The fourth sub-display panel 104 may be adjacent to the second sub-display panel 102 in the second direction DR2 and may be adjacent to the third sub-display panel 103 in the first direction DR1. For another example, the sub-display panels may be continuously arranged along a direction. In addition, the display panel 100 may include two, three, or five or more sub-display panels.

The first sub-display panel 101 may include a display area in which an image is displayed and a peripheral area disposed adjacent to the display area.

The first sub-display panel 101 may include pixels PX as illustrated in FIG. 1 and gate lines GL, data lines DL, connection lines CL, dummy lines DML, and ground lines GNL as illustrated in FIG. 2.

The pixels PX may be electrically connected to the gate and data lines GL and DL. The pixels PX may emit light by receiving signals and/or voltages from the gate and data lines GL and DL. The gate and data lines GL and DL may cross each other. For example, each of the gate lines GL may extend in the first direction DR1, and each of the data lines DL may extend in the second direction DR2.

Each of the connection lines CL may cross each of the gate lines GL. For example, each of the connection lines CL may extend in the second direction DR2. The connection lines CL may be electrically connected to corresponding ones of the gate lines GL, respectively. The connection lines CL may transmit gate signals generated by the gate driver GDV to the corresponding ones of the gate lines GL, respectively.

In an embodiment, each of the ground lines GNL may be disposed at an edge of the first sub-display panel 101. For example, the ground lines GNL may be disposed at edges of the first sub-display panel 101 to surround the pixels PX included in the first sub-display panel 101 in a plan view.

In an embodiment, the ground lines GNL may include at least one first ground line GNL1 extending in the second direction DR2 and at least one second ground line GNL2 extending in the first direction DR1. For example, as illustrated in FIG. 2, each of the first ground lines GNL1 may be disposed at an edge positioned in the first direction DR1 of the first sub-display panel 101 and may be disposed at an edge positioned in a third direction DR3 opposite the first direction DR1 of the first sub-display panel 101. That is, the first ground lines GNL1 may be disposed at edges of the first sub-display panel 101 extending in the second direction DR2. Each of the second ground lines GNL2 may be disposed at an edge positioned in the second direction DR2 of the first sub-display panel 101 and may be disposed at an edge positioned in a fourth direction DR4 opposite to the second direction DR2 of the first sub-display panel 101. That is, the second ground lines GNL2 may be disposed at edges of the first sub-display panel 101 extending in the first direction DR1. Each of the first and second ground lines GNL1 and GNL2 may be grounded. The first and second ground lines GNL1 and GNL2 may protect internal structures of the first sub-display panel 101, such as pixels PX, from static electricity generated at the edges of the first sub-display panel 101.

In a process of manufacturing the display device 10, the static electricity may be generated or introduced into the first sub-display panel 101. For example, the static electricity may be generated or introduced into the first sub-display panel 101 when cutting the first sub-display panel 101 from a mother glass or bonding the first sub-display panel 101 to the second to fourth sub-display panels 102, 103 and 104. The first and second ground lines GNL1 and GNL2 may prevent or reduce the static electricity from introducing into the first sub-display panel 101. In addition, the first and second ground lines GNL1 and GNL2 may be electrically connected to each other to improve a grounding effect. Accordingly, a reliability of the display device 10 according to embodiments may be improved.

In an embodiment, each of the dummy lines DML may extend in the second direction DR2. A constant voltage may be provided to each of the dummy lines DML. For example, a gate turn-off voltage Voff may be provided to each of the dummy lines DML. For another example, each of the dummy lines DML may be electrically floating. In another embodiment, the dummy lines DML may be omitted.

In an embodiment, each of the second to fourth sub-display panels 102, 103, and 104 may have a substantially same structure as the first sub-display panel 101. For example, each of the second to fourth sub-display panels 102, 103, and 104 may include the pixels PX, the gate lines GL, the data lines DL, the connection lines CL, the dummy lines DML, and the ground lines GNL.

The driving controller CON may generate a gate control signal GCTRL, a data control signal DCTRL, and output image data ODAT based on an input image data IDAT and an input control signal CTRL provided from an external device. For example, the input image data IDAT may be RGB data including red image data, green image data, and blue image data. The input control signal CTRL may include a master clock signal and an input data enable signal. The input control signal CTRL may further include a vertical synchronization signal and a horizontal synchronization signal.

The gate driver GDV may generate gate signals based on the gate control signal GCTRL provided from the driving controller CON. For example, the gate control signal GCTRL may include a vertical start signal and a gate clock signal. The gate driver GDV may sequentially output the gate signals to the connection lines CL. The gate lines GL may sequentially receive the gate signals from the gate driver GDV through corresponding ones of the connection lines CL, respectively.

The data driver DDV may generate data voltages based on the data control signal DCTRL and the output image data ODAT provided from the driving controller CON. For example, the data control signal DCTRL may include an output data enable signal, a horizontal start signal, and a load signal. The data driver DDV may output the data voltages to the data lines DL In an embodiment, as illustrated in FIG. 1, the display device 10 may further include a flexible circuit board 200. For example, the gate driver GDV and the data driver DDV may be disposed on the flexible circuit board 200. For example, the gate driver GDV may include a plurality of gate driving chips, and the data driver DDV may include a plurality of source driving chips. The gate and source driving chips 210 may be disposed on the flexible circuit board 200.

In an embodiment, each of the flexible circuit board 200 may include both the gate driving chip and the source driving chip. In this case, the gate and source driving chips may be disposed in a same direction with respect to the display panel 100.

In an embodiment, the display device 10 may further include a printed circuit board (not illustrated). For example, the driving controller CON may be disposed on the printed circuit board. For example, a side of the flexible circuit board 200 may be connected to the display panel 100, and another side of the flexible circuit board 200 may be connected to the printed circuit board.

The flexible circuit board 200 may electrically connect the printed circuit board and the display panel 100. For example, the printed circuit board and the flexible circuit board 200 may be electrically connected to each other by a conductive film such as an anisotropic conductive film (ACF), and the flexible circuit board 200 and the display panel 100 may be electrically connected to each other by another conductive film.

In another embodiment, the gate driver GDV and/or the data driver DDV may be mounted on the display panel 100 or integrated in the display panel 100.

Figure 3:
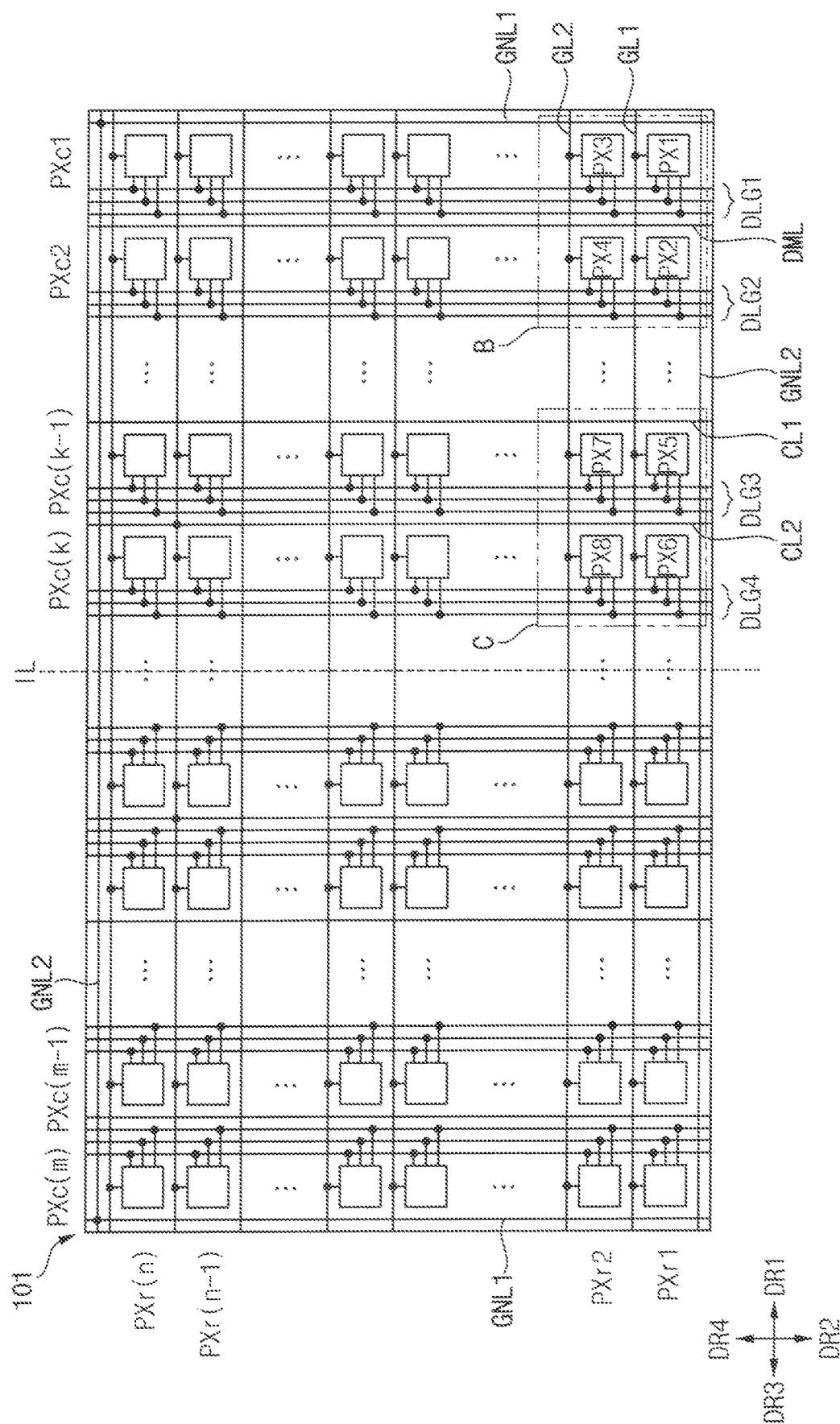
FIG. 3 is a plan view illustrating a first sub-display panel according to an embodiment.

FIG. 3 is a plan view illustrating a first sub-display panel according to an embodiment.

Referring to FIG. 3, the first sub-display panel 101 may include the pixels PX, the gate lines GL, data line groups DLG, the connection lines CL, the dummy lines DML, the first ground line GNL1, and the second ground line GNL2.

The pixels PX may be arranged in a matrix form. For example, as illustrated in FIG. 3, the display area of the first sub-display panel 101 may be divided into a plurality of pixel rows and a plurality of pixel columns. The pixel columns may include first pixel column PXc(1) to (m)th pixel column PXc(m) arranged along the third direction DR3 (where m is an integer of 2 or more). The pixel rows may include first pixel row PXr(1) to (n)th pixel row PXr(n) arranged along the fourth direction DR4 (where n is an integer of 2 or more). That is, (n×m) number of pixels PX may be disposed in the first sub-display panel 101.

Each of the pixels PX may include a plurality of sub-pixels. For example, each of the pixels PX may include a first sub-pixel emitting red light, a second sub-pixel emitting green light, and a third sub-pixel emitting blue light.

Each of the gate lines GL disposed in the first sub-display panel 101 may be electrically connected to the pixels PX disposed in a corresponding one of the pixel rows, respectively. For example, a number of the pixel rows and a number of the gate lines GL may be the same. That is, n number of gate lines GL may be disposed in the first sub-display panel 101.

Each of the data line groups DLG disposed in the first sub-display panel 101 may be electrically connected to the pixels PX disposed in a corresponding one of the pixel columns, respectively. For example, each of the data line groups DLG may include first to third data lines DL electrically connected to corresponding ones of the first to third sub-pixels, respectively. For example, a number of the pixel columns and a number of the data line groups DLG may be the same. That is, m number of data line groups DLG and 3 m number of data lines DL may be disposed in the first sub-display panel 101.

Each of the connection lines CL disposed in the first sub-display panel 101 may be electrically connected to a corresponding one of the gate lines GL. For example, a number of connection lines and a number of the gate lines GL may be the same. That is, n number of connection lines CL may be disposed in the first sub-display panel 101.

The first ground lines GNL1 extending in the second direction DR2 and the second ground lines GNL2 extending in the first direction DR1 may be disposed at the edges of the first sub-display panel 101. For example, two first ground lines GNL1 and two second ground lines GNL2 may be disposed in the first sub-display panel 101 to entirely surround the pixels PX.

In an embodiment, each of the dummy lines DML may extend in the second direction DR2. For example, the dummy lines DML may be disposed outside the connection lines CL. That is, the dummy lines DML may be disposed adjacent to each of the first ground lines GNL1. For another example, each of the dummy lines DML may be disposed between two connection lines CL adjacent to each other. In another embodiment, the dummy lines DML may be omitted.

In an embodiment, the dummy lines DML, the first ground lines GNL1, and the connection lines CL may be formed simultaneously. For example, in order to form the connection lines CL, a plurality of first lines extending in the second direction DR2 may be formed to the corresponding ones of the pixel columns, respectively. The first lines may include the connection lines CL, the dummy lines DML, and the first ground lines GNL1.

For example, m number of the first lines may be disposed in the first sub-display panel 101, and one first line among the m number of the first lines may be disposed to correspond to each of the pixel columns. That is, one first line may be disposed between two pixel columns adjacent to each other. In this case, two first lines disposed at outermost (e.g. left and right ends) among the m number of the first lines may be used as the first ground line GNL1. N number of the first lines among the m number of the first lines may be used as the connection lines CL. Remaining the first lines (e.g. (m-n-2) number of the first lines) among the m number of the first lines may be used as the dummy lines DML.

For another example, although not illustrated in the drawing, a plurality of the first lines may be disposed to correspond to each of the pixel columns. That is, the plurality of the first lines may be disposed between two pixel columns adjacent to each other. In detail, 2 m number of the first lines may be disposed in the first sub-display panel 101, and two first lines adjacent to each other among the 2 m number of the first lines may be disposed to correspond to each of the pixel columns. In this case, two first lines disposed at outermost among the 2 m number of the first lines may be used as the first ground line GNL1. N number of the first lines among the 2 m number of the first lines may be used as the connection lines CL. Remaining the first lines (e.g. (2 m-n-2) number of the first lines) among the 2 m number of the first lines may be used as the dummy lines DML. In other words, by using outermost (e.g. left and right ends) lines among a plurality of dummy lines DML as the first ground lines GNL1 without adding new lines extending the second direction DR2 to the first sub-display panel 101, a pitch between two pixels PX adjacent to each other included in the display device 10 may be maintained.

For example, as illustrated in FIG. 3, first, second, fifth, and sixth pixels PX1, PX2, PX5, and PX6 may be disposed in a first pixel row PXr(1), and may be electrically connected to a first gate line GL1. Third, fourth, seventh, and eighth pixels PX3, PX4, PX7, and PX8 may be disposed in a second pixel row PXr(2), and may be electrically connected to a second gate line GL2.

For example, the first and third pixels PX1 and PX3 may be disposed in a first pixel column PXc(1), and may be electrically connected to a first data line group DLG1. The second and fourth pixels PX2 and PX4 may be disposed in a second pixel column PXc(2), and may be electrically connected to a second data line group DLG2. The fifth and seventh pixels PX5 and PX7 may be disposed in a (k-1)th pixel column PXc(k-1), and may be electrically connected to a third data line group DLG3. The sixth and eighth pixels PX6 and PX8 may be disposed in a (k)th pixel column PXc(k) and may be electrically connected to a fourth data line group DLG4. For example, at least one data line group DLG may be disposed between the second data line group DLG2 and the third data line group DLG3. Each of the first to fourth data line groups DLG1, DLG2, DLG3 and DLG4 may include a plurality of data lines DL.

For example, the first ground lines GNL1 may be disposed to correspond to each of the first and (m)th pixel columns PXc(1) and PXc(m), respectively. That is, a first ground line GNL1 may be disposed adjacent to the first pixel column PXc(1) in the first direction DR1, and another first ground line GLN1 may be disposed adjacent to the (m)th pixel column PXc(m) in the third direction DR3. Each of the first ground lines GNL1 may extend in the second direction DR2.

For example, a second ground line GNL2 may be disposed adjacent to the first pixel row PXr(1) in the second direction DR2, and another second ground line GLN2 may be disposed adjacent to the (n)th pixel row PXr(n) in the fourth direction DR4. Each of the second ground line GNL2 may extend in the first direction DR1. That is, two first ground line GNL1 and two second ground line GNL2 may be disposed in the first sub-display panel 101 to surround the pixels PX.

For example, a first connection line CL1 may be disposed to correspond to the (k-1)th pixel column PXc(k-1). The first connection line CL1 may extend in the second direction DR2, and may be electrically connected to the first gate line GL1. A second connection line CL2 may be disposed to correspond to the (k)th pixel column PXc(k). The second connection line CL2 may extend in the second direction DR2, and may be electrically connected to the second gate line GL2.

For example, a dummy line DML may be disposed to correspond to a second pixel column PXc(2). That is, the dummy line DML may be disposed between the first connection line CL1 and the first ground line GNL1 adjacent to the first pixel column PXc(1) in the first direction DR1. However, this is exemplary, the dummy line DML may be disposed between two connection lines CL adjacent to each other, or the dummy line DML may be omitted. When the dummy line DML is omitted, the first connection line CL1 may be adjacent to the first pixel PX1.

For example, although not illustrated in the drawing, the first sub-display panel 101 may further include high power voltage lines, low power voltage lines, and sensing lines. Each of the pixels PX may receive a high power voltage ELVDD from each of the high power voltage lines, and may receive a low power voltage ELVSS from each of the low power voltage lines. For example, the high power voltage ELVDD may be greater than the low power voltage ELVSS. Each of the pixels PX may receive an initialization voltage from each of the sensing lines.

For example, as illustrated in FIG. 3, lines (or pixels PX) disposed in the first sub-display panel 101 may be symmetrical to each other with respect to an imaginary center line IL extending in the second direction DR2 and across a center of the first sub-display panel 101. That is, the first pixel column PXc(1) and the (m)th pixel column PXc(m) may be symmetrical with respect to the imaginary center line IL. Lines disposed to correspond to the first pixel column PXc(1) and lines disposed to correspond to the (m)th pixel column PXc(m) may be symmetrical with respect to the imaginary center line IL. For another example, the lines (or pixels PX) disposed in the first sub-display panel 101 may be asymmetrical to each other with respect to the imaginary center line IL.

Figure 4:
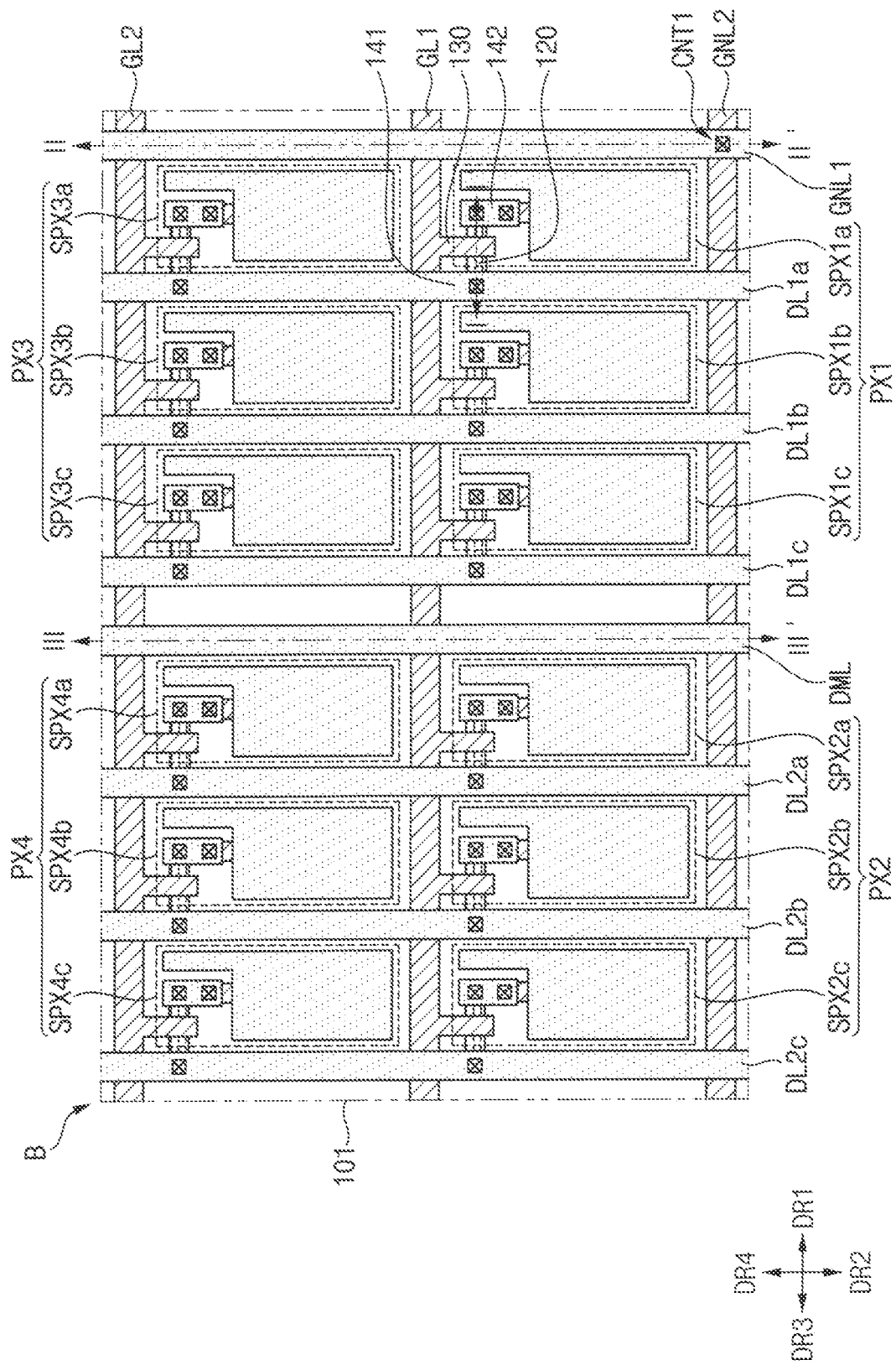
FIG. 4 is a layout view corresponding to an area "B" of FIG. 3.
Figure 5:
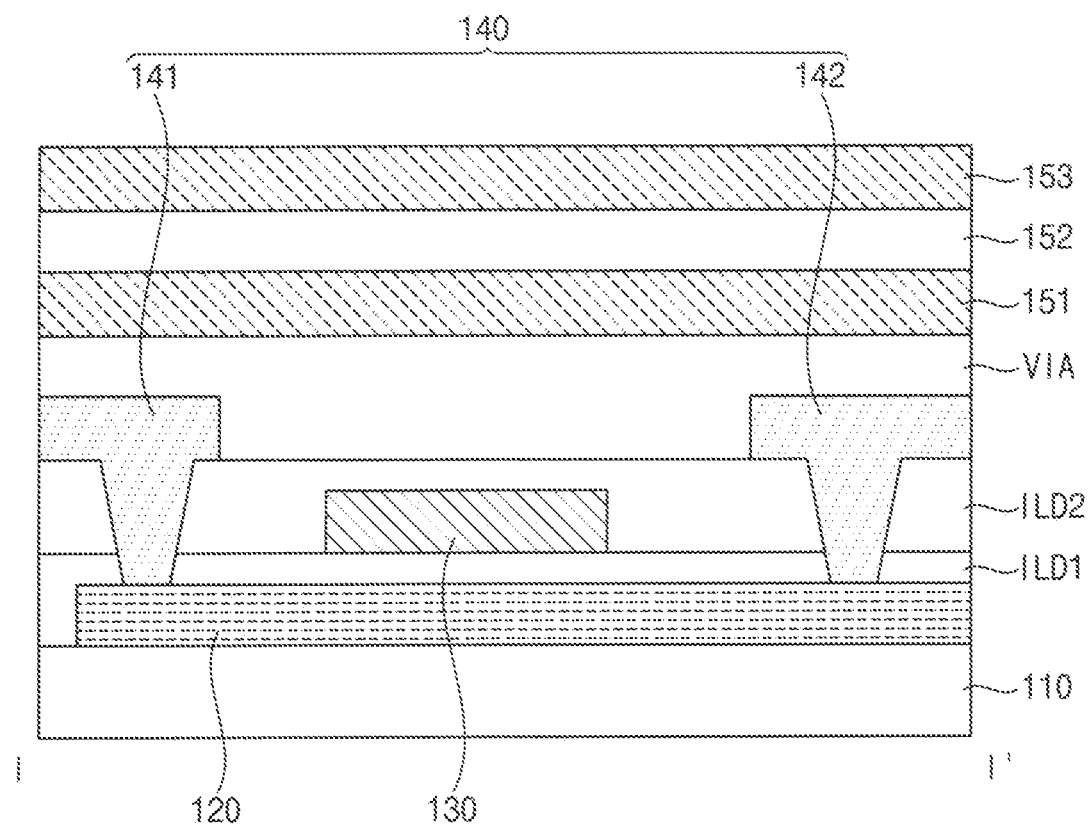
FIG. 5 is a cross-sectional view taken along a line I-I' of FIG. 4.
Figure 6:
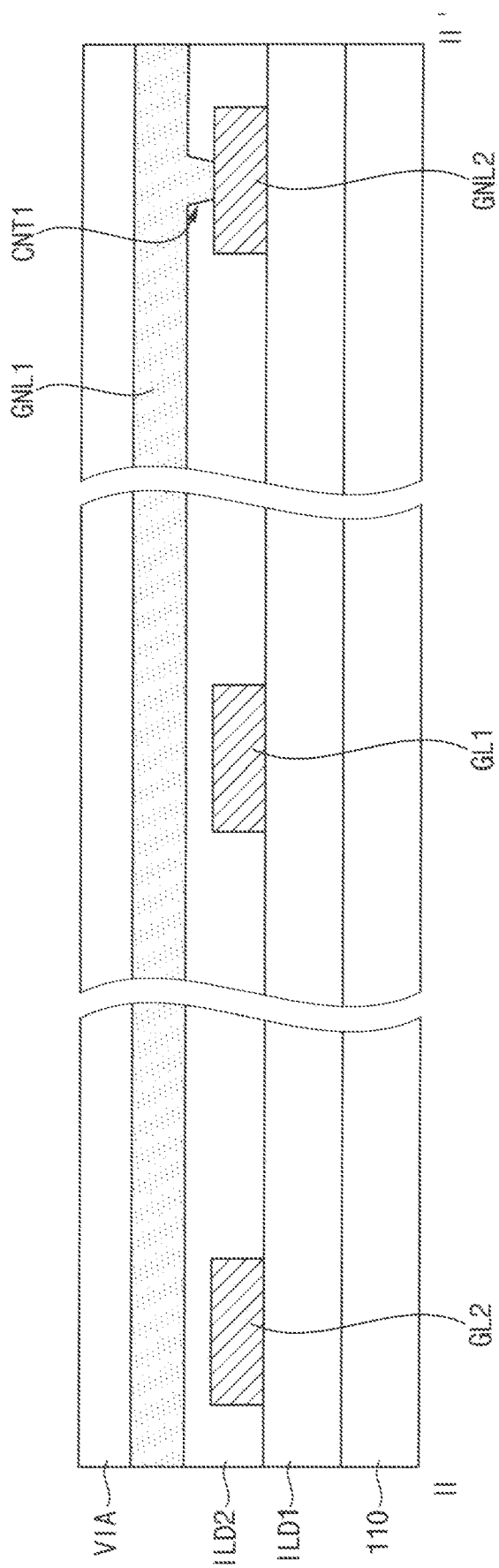
FIG. 6 is a cross-sectional view taken along a line II-II' of FIG. 4.
Figure 7:
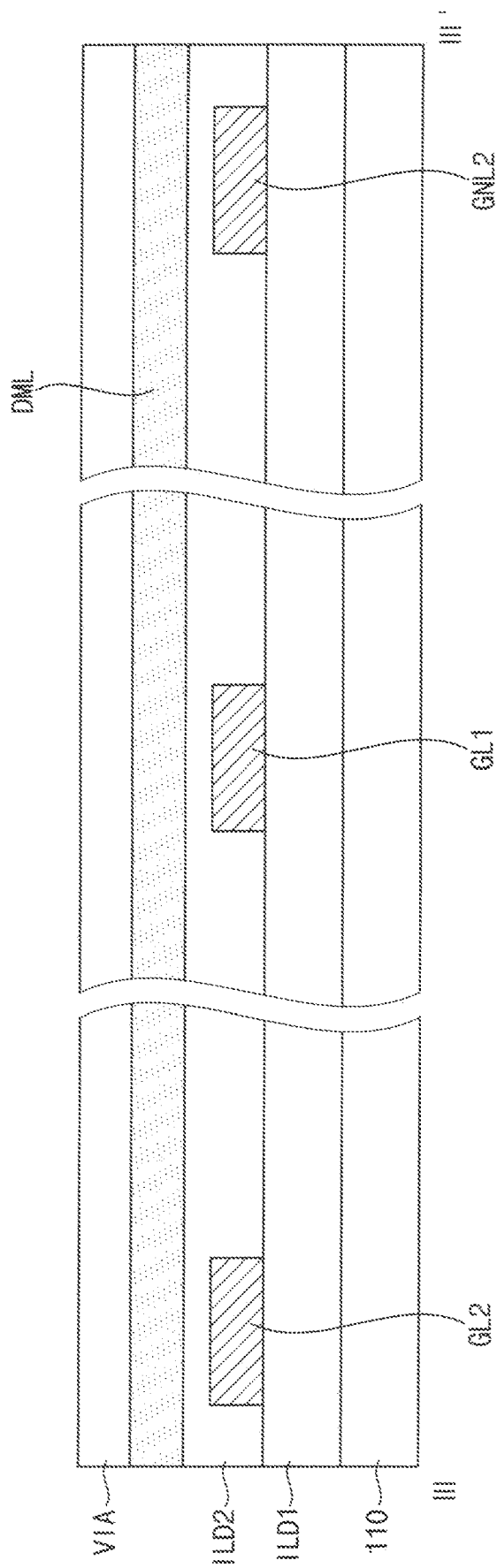
FIG. 7 is a cross-sectional view taken along a line III-III' of FIG. 4.

FIG. 4 is a layout view corresponding to an area "B" of FIG. 3. FIG. 5 is a cross-sectional view taken along a line I-I' of FIG. 4. FIG. 6 is a cross-sectional view taken along a line II-II' of FIG. 4. FIG. 7 is a cross-sectional view taken along a line III-III' of FIG. 4.

Referring to FIGS. 1, 3, 4, 5, 6 and 7, the second sub-display panel 102 may be positioned in the first direction DR1 of the first and second pixels PX1 and PX2, and the third sub-display panel 103 may be positioned in the second direction DR2 of the first and third pixels PX1 and PX3. For example, the second pixel PX2 may be adjacent to the first pixel PX1 in the third direction DR3 and may be spaced apart from the second sub-display panel 102 by the first pixel PX1. The third pixel PX3 may be adjacent to the first pixel PX1 in the fourth direction DR4 and may be spaced apart from the third sub-display panel 103 by the first pixel PX1. The fourth pixel PX4 may be adjacent to the second pixel PX2 in the fourth direction DR4 and may be adjacent to the third pixel PX3 in the third direction DR3.

The first pixel PX1 may include first to third sub-pixels SPX1a, SPX1b, and SPX1c. For example, the first sub-pixel SPX1a may emit a red light, the second sub-pixel SPX1b may emit a green light, and the third sub-pixel SPX1c may emit a blue light. Each of the second to fourth pixels PX2, PX3, and PX4 may have a substantially same structure as the first pixel PX1 and may be driven in a substantially same driving method.

Each of the first and second pixels PX1 and PX2 may be electrically connected to the first gate line GL1 and may receive a first gate signal. Each of the third and fourth pixels PX3 and PX4 may be electrically connected to the second gate line GL2 and may receive a second gate signal. Each of the first and second gate lines GL1 and GL2 may extend in the first direction DR1.

Each of the first and third pixels PX1 and PX3 may be electrically connected to first to third data lines DL1a, DL1b, and DL1c included in the first data line group DLG1. Each of the second and fourth pixels PX2 and PX4 may be electrically connected to first to third data lines DL2a, DL2b, and DL2c included in the second data line group DLG2. The first to third sub-pixels SPX1a, SPX3a, SPX1b, SPX3b, SPX1c, and SPX3c included in the first and third pixels PX1 and PX3 may be electrically connected to corresponding ones of the first to third data lines DL1a, DL1b, and DL1c included in the first data line group DLG1, respectively, and may receive a data voltage. The first to third sub-pixels SPX2a, SPX4a, SPX2b, SPX4b, SPX2c, and SPX4c included in the second and fourth pixels PX2 and PX4 may be electrically connected to corresponding ones of the first to third data lines DL2a, DL2b, and DL2c included in the second data line group DLG2, respectively, and may receive a data voltage. Each of the data lines DL1a, DL1b, DL1c, DL2a, DL2b, and DL2c may extend in the second direction DR2.

The first ground line GNL1 may be positioned in the first direction DR1 of the first pixel PX1. For example, the first ground line GNL1 may be adjacent to the first pixel PX1 in the first direction DR1. That is, the first ground line GNL1 may be disposed between the first pixel PX and the second sub-display panel 102. The first ground line GNL1 may extend in the second direction DR2.

The first ground line GNL1 may not be electrically connected to each of the first and second gate lines GL1 and GL2. For example, the first ground line GNL1 may overlap each of the first and second gate lines GL1 and GL2 in a plan view. The first ground line GNL1 may be disposed in a different layer from each of the first and second gate lines GL1 and GL2. A contact hole may not be formed in a region where the first ground line GNL1 and the first gate line GL1 overlap, and a region where the first ground line GNL1 and the second gate line GL2 overlap. Accordingly, the first ground line GNL1 may not contact each of the first and second gate lines GL1 and GL2.

The second ground line GNL2 may be positioned in the second direction DR2 of the first pixel PX1. For example, the second ground line GNL2 may be adjacent to the first pixel PX1 in the second direction DR2. That is, the second ground line GNL2 may be disposed between the first pixel PX and the third sub-display panel 103. The second ground line GNL2 may extend in the first direction DR1.

The second ground line GNL2 may not be electrically connected to each of the data lines DL1a, DL1b, DL1c, DL2a, DL2b, and DL2c. For example, the second ground line GNL2 may overlap each of the data lines DL1a, DL1b, DL1c, DL2a, DL2b, and DL2c in a plan view. The second ground line GNL2 may be disposed in a different layer from each of the data lines DL1a, DL1b, DL1c, DL2a, DL2b, and DL2c. A contact hole may not be formed in regions where the second ground line GNL2 and each of the data lines DL1a, DL1b, DL1c, DL2a, DL2b, and DL2c overlap. Accordingly, the second ground line GNL2 may not contact each of the data lines DL1a, DL1b, DL1c, DL2a, DL2b, and DL2c.

In an embodiment, the first and second ground lines GNL1 and GNL2 may be electrically connected to each other. The first and second ground lines GNL1 and GNL2 may overlap to each other in a plan view. For example, the first and second ground lines GNL1 and GNL2 may be perpendicular to each other in a plan view. The first ground line GNL1 may be disposed in a different layer from the second ground line GNL2. A first contact hole CNT1 may be formed in a region where the first ground line GNL1 and the second ground line GNL2 overlap. Accordingly, the first and second ground lines GNL1 and GNL2 may contact each other.

The dummy line DML may be disposed between the first pixel PX1 and the second pixel PX2. For example, the dummy line DML may be adjacent to the first pixel PX1 in the third direction DR3, and may be adjacent to the second pixel PX2 in the first direction DR1. The dummy line DML may extend in the second direction DR2.

The dummy line DML may not be electrically connected to each of the second ground line GNL2, the first gate line GL1, and the second gate line GL2. For example, the dummy line DML may overlap each of the second ground line GNL2, the first gate line GL1, and the second gate line GL2 in a plan view. The dummy line DML may be disposed in a different layer from each of the second ground line GNL2, the first gate line GL1, and the second gate line GL2. A contact hole may not be formed in a region where the dummy line DML and the second ground line GNL2 overlap, a region where the dummy line DML and the first gate line GL1, and a region where the dummy line DML and the second gate line GL2 overlap. Accordingly, the dummy line DML may not contact each of the second ground line GNL2, the first gate line GL1, and the second gate line GL2.

For example, the first sub-pixel SPX1a included in the first pixel PX may include first to third transistors, a storage capacitor, and a light emitting diode. Each of the second and third sub-pixels SPX1b and SPX1c may have a substantially same structure as the first sub-pixel SPX1a, and may be driven in a substantially same driving method. The light emitting diode may include an organic light emitting diode, a nano light emitting diode, or the like.

The first transistor may include a control terminal connected to the second transistor, a first terminal connected to the high power voltage line, and a second terminal connected to the light emitting diode. For example, the first transistor may be referred to as a driving transistor.

The second transistor may include a control terminal connected to the first gate line GL1, a first terminal connected to the first data line DL1a, and a second terminal connected to the first transistor. For example, the second transistor may be referred to as a switching transistor.

The third transistor may include a control terminal connected to the first gate line GL1, a first terminal connected to the light emitting diode, and a second terminal connected to the sensing line. For example, the third transistor may be referred to as a sensing transistor.

The storage capacitor may include a first terminal connected to the control terminal of the first transistor and a second terminal connected to the second terminal of the first transistor.

The organic light emitting diode may include a first terminal connected to the first transistor and a second terminal connected to the low power voltage line. For example, the first terminal may be an anode terminal, and the second terminal may be a cathode terminal. The organic light emitting diode may include functional layers (e.g. electron/hole injection layers and electron/hole transport layers) and an organic material layer disposed between the functional layers, and may emit light in a certain wavelength range depending on a material constituting the organic material layer.

The nano light emitting diode may include a first terminal connected to the first transistor and a second terminal connected to the low power voltage line. For example, the first terminal may be an anode terminal, and the second terminal may be a cathode terminal. The nano light emitting diode may include semiconductor layers (e.g. an n-type semiconductor layer and a p-type semiconductor layer) and an active material layer disposed between the semiconductor layers. Accordingly, light in a certain wavelength range can be emitted.

In an embodiment, as illustrated in FIGS. 4 and 5, the first sub-display panel 101 may include a substrate 110, an active pattern 120, a first insulating layer ILD1, a gate electrode 130, a second insulating layer ILD2, a connection electrode 140, a via insulating layer VIA, a first electrode 151, an emission layer 152, and a second electrode 153.

In an embodiment, the substrate 110 may include a glass substrate, a quartz substrate, a plastic substrate, or the like.

The active pattern 120 may be disposed on the substrate 110. For example, the active pattern 120 may include amorphous silicon, polycrystalline silicon, or an oxide semiconductor. In an embodiment, ions may be selectively implanted into the active pattern 120. For example, when each of the first to third transistors is the N-type transistor, the active pattern 120 may include a source region and a drain region into which anions are injected, and a channel region into which the anions are not injected.

In an embodiment, although not illustrated in the drawing, a buffer layer may be disposed between the substrate 110 and the active pattern 120. The buffer layer may include an insulating material.

The first insulating layer ILD1 may cover the active pattern 120 and may be disposed on the substrate 110. The first insulating layer ILD1 may include an insulating material.

The gate electrode 130 may be disposed on the first insulating layer ILD1. In an embodiment, the gate electrode 130 may receive the first gate signal through the first gate line GL1. For example, the gate electrode 130 may include a metal, an alloy, a conductive metal oxide, a transparent conductive material, or the like. For example, the gate electrode 130 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), or the like.

The second insulating layer ILD2 may cover the gate electrode 130 and may be disposed on the first insulating layer ILD1. The second insulating layer ILD2 may include an insulating material.

The connection electrode 140 may be disposed on the second insulating layer ILD2. For example, the connection electrode 140 may include a metal, an alloy, a conductive metal oxide, a transparent conductive material, or the like. For example, the connection electrode 140 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. In an embodiment, in order to reduce an electrical resistance of the connection electrode 140, the connection electrode 140 may include Al. For example, the connection electrode 140 may have Ti/Al/Ti structure.

In an embodiment, the connection electrode 140 may include a source electrode 141 and a drain electrode 142. The source electrode 141 may receive a data voltage through the first data line DL1a. For example, the source electrode 141 may be disposed in a substantially same layer as the first data line DL1a. For example, the source electrode 141 may be a portion of the first data line DL1a. The source electrode 141 may contact the active pattern 120 through a contact hole formed in the first and second insulating layers ILD1 and ILD2. The drain electrode 142 may contact the active pattern 120 through a contact hole formed in the first and second insulating layers ILD1 and ILD2. Each of the source and drain electrodes 141 and 142 may not overlap the gate electrode 130.

In an embodiment, the source electrode 141 may correspond to the first terminal of the second transistor, the drain electrode 142 may correspond to the second terminal of the second transistor, and the gate electrode 130 may correspond to the control terminal of the second transistor. Accordingly, the active pattern 120, the gate electrode 130, the source electrode 141, and the drain electrode 142 may constitute the second transistor.

The via insulating layer VIA may cover the connection electrode 140 and may be disposed on the second insulating layer ILD2. For example, the via insulating layer VIA may have a substantially flat upper surface. In an embodiment, the via insulating layer VIA may include an organic insulating material. For example, the via insulating layer VIA may include a photoresist, a polyacrylic resin, a polyimide resin, an acrylic resin, or the like.

The first electrode 151 may be disposed on the via insulating layer VIA. For example, the first electrode 151 may include a metal, an alloy, a conductive metal oxide, a transparent conductive material, or the like. The emission layer 152 may be disposed on the first electrode 151. In an embodiment, a pixel defining layer including an opening exposing an upper surface of the first electrode 151 may be disposed on the first electrode 151, and the emission layer 152 may be disposed in the opening. For example, the emission layer 152 may include an organic emission material. The organic emission material may emit light by receiving electric current. The second electrode 153 may be disposed on the emission layer 152. For example, the second electrode 153 may include a metal, an alloy, a conductive metal oxide, a transparent conductive material, or the like. In an embodiment, the first electrode 151, the emission layer 152, and the second electrode 153 may constitute the organic light emitting diode.

In an embodiment, as illustrated in FIGS. 4, 6, and 7, the first ground line GNL1 and the dummy line DML may be disposed on the second insulating layer ILD2. That is, the first ground line GNL1 and the dummy line DML may be disposed in a substantially same layer as the connection electrode 140 and the data lines DL1a, DL1b, DL1c, DL2a, DL2b, and DL2c. For example, the first ground line GNL1, the dummy line DML, the connection electrode 140 and the data lines DL1a, DL1b, DL1c, DL2a, DL2b, and DL2c may be formed simultaneously using a same material.

The second ground line GNL2 may be disposed on the first insulating layer ILD1. That is, the second ground line GNL2 may be disposed in a substantially same layer as the gate electrode 130, the first gate line GL1, and the second gate line GL2. For example, the second ground line GNL2, the gate electrode 130, the first gate line GL1, and the second gate line GL2 may be formed simultaneously using a same material.

As illustrated in FIG. 6 (cross-sectional view taken along line II-II' of FIG. 4) and FIG. 7 (cross-sectional view taken along line III-III' of FIG. 4), a second insulating layer ILD2 may be disposed between the first ground line GNL1 and the first gate line GL1, between the first ground line GNL1 and the second gate line GL2, and between the first ground line GNL1 and the second ground line GNL2.

A contact hole may not be formed in the second insulating layer ILD2 in a region where the first ground line GNL1 and the first gate line GL1 overlap, and a region where the first ground line GNL1 and the second gate line GL2 overlap. Accordingly, the first ground line GNL1 may not contact each of the first and second gate lines, GL1 and GL2, and may not be electrically connected.

A first contact hole CNT1 may be formed in the second insulating layer ILD2 in a region where the first ground line GNL1 and the second ground line GNL2 overlap. Accordingly, the first and second ground lines, GNL1 and GNL2, may contact each other and may be electrically connected.

As illustrated in FIG. 7, a second insulating layer ILD2 may be disposed between the dummy line DML and the first gate line GL1, between the dummy line DML and the second gate line GL2, and between the dummy line DML and the second ground line GNL2.

A contact hole may not be formed in the second insulating layer ILD2 in a region where the dummy line DML and the first gate line GL1 overlap, a region where the dummy line DML and the second gate line GL2 overlap, and a region where the dummy line DML and the second ground line GNL2 overlap. Accordingly, the first ground line GNL1 may not contact each of the first gate line GL1, the second gate line GL2, and the second ground line GNL2, and may not be electrically connected.

Figure 8:
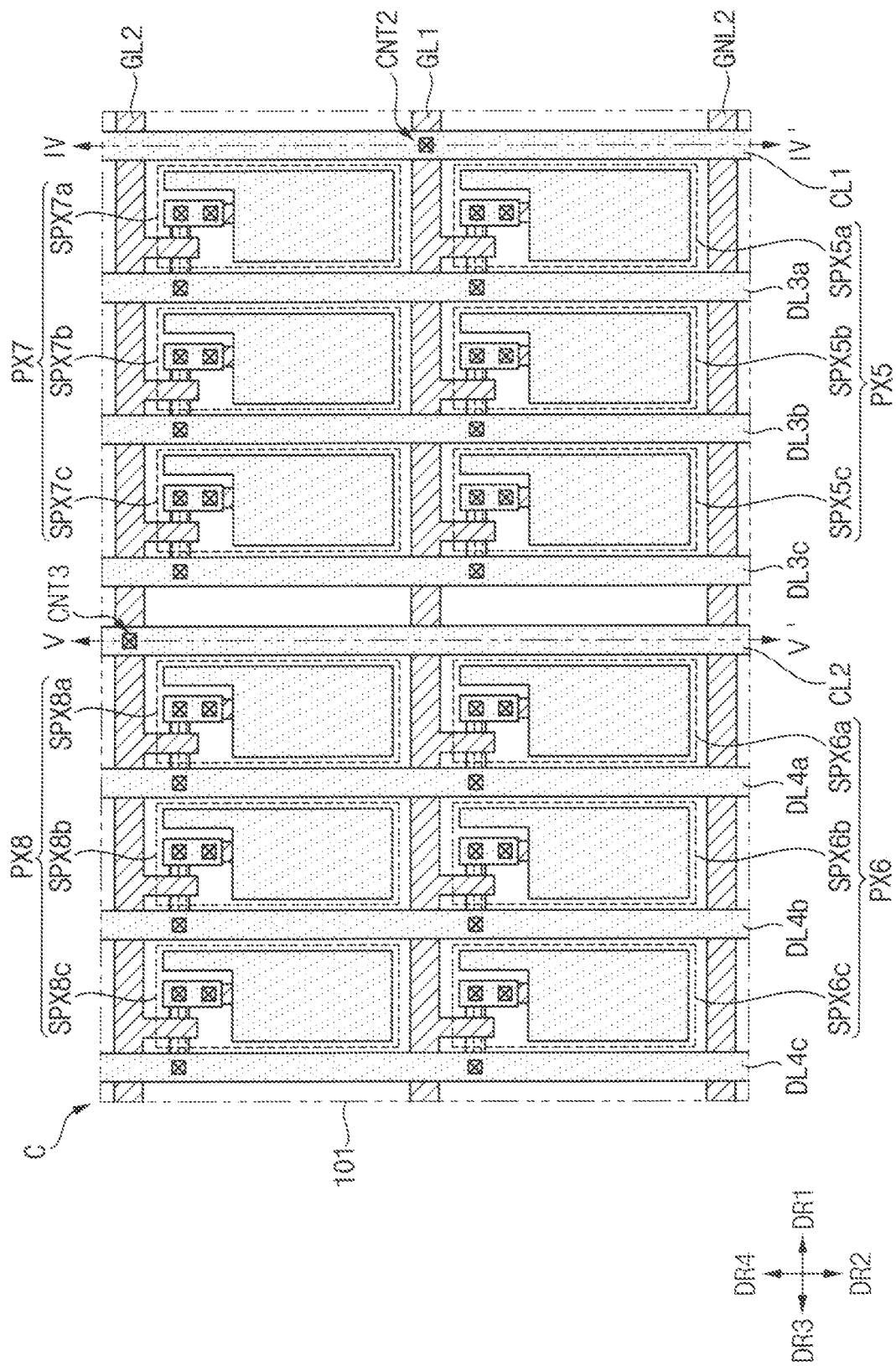
FIG. 8 is a layout view corresponding to an area "C" of FIG. 3.
Figure 9:
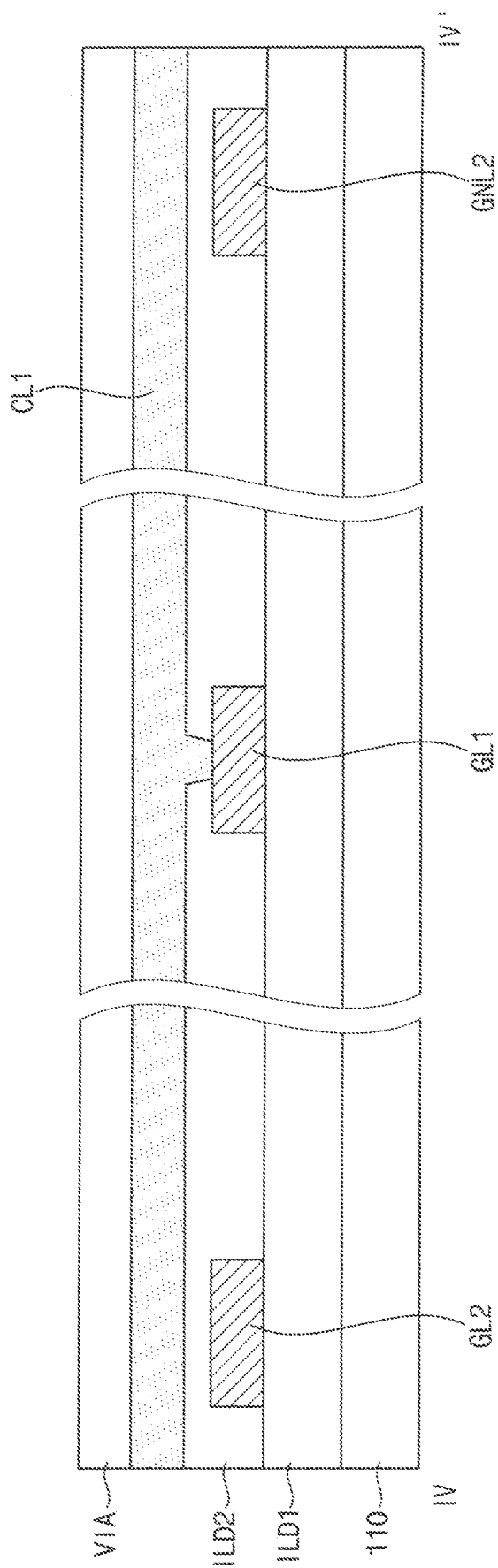
FIG. 9 is a cross-sectional view taken along a line IV-IV' of FIG. 8.
Figure 10:
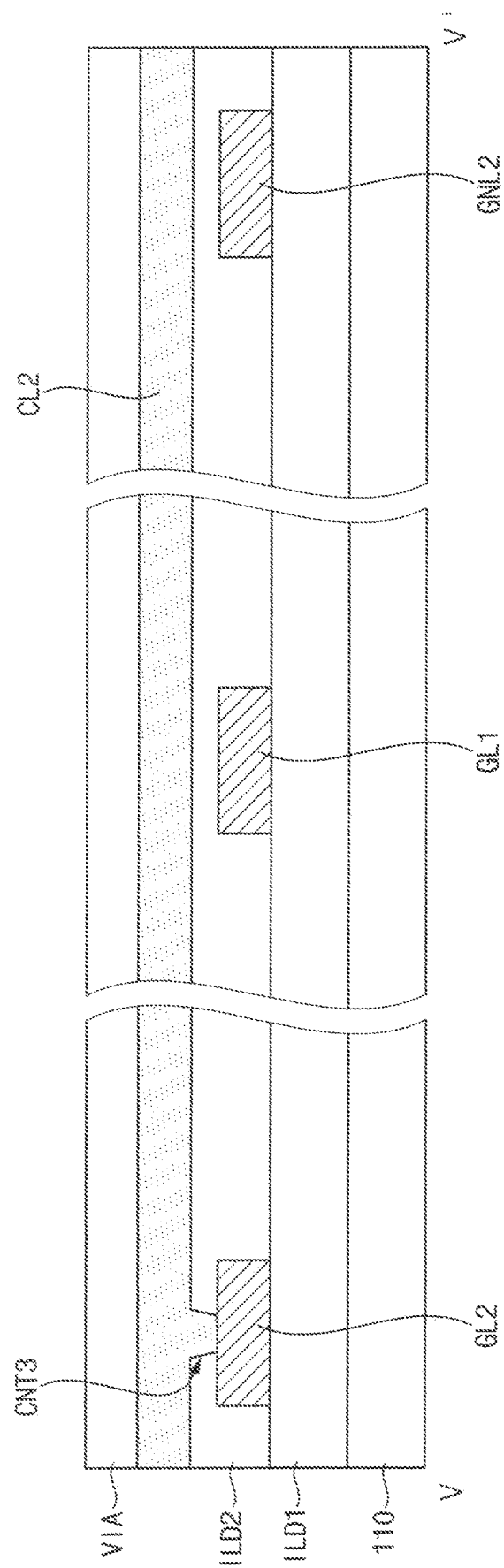
FIG. 10 is a cross-sectional view taken along a line V-V' of FIG. 8.

FIG. 8 is a layout view corresponding to an area "C" of FIG. 3. FIG. 9 is a cross-sectional view taken along a line IV-IV' of FIG. 8. FIG. 10 is a cross-sectional view taken along a line V-V' of FIG. 8.

Referring to FIGS. 3, 8, 9 and 10, the fifth and sixth pixels PX5 and PX6 may be disposed in the third direction DR3 from the first and second pixels PX1 and PX2. For example, the fifth pixel PX5 may be spaced apart from the first pixel PX1 in the third direction DR3. That is, the fifth pixel PX5 may be adjacent to or spaced apart from the second pixel PX2 in the third direction DR3. Each of the seventh and eighth pixels PX7 and PX8 may be adjacent to each of the fifth and sixth pixels PX5 and PX6 in the fourth direction DR4. Each of the fifth to eighth pixels PX5, PX6, PX7, and PX8 may have a substantially same structure as the first pixel PX1 and may be driven in a substantially same driving method.

Each of the fifth and sixth pixels PX5 and PX6 may be electrically connected to the first gate line GL1 and may receive a gate signal. Each of the seventh and eighth pixels PX7 and PX8 may be electrically connected to the second gate line GL2 and may receive a gate signal.

Each of the fifth and seventh pixels PX5 and PX7 may be electrically connected to the data lines DL3a, DL3b, and DL3c included in the third data line group DLG3 and may receive a data voltage. Each of the sixth and eighth pixels PX6 and PX8 may be electrically connected to the data lines DL4a, DL4b, and DL4c included in the fourth data line group DLG4 and may receive a data voltage.

The second ground line GNL2 may be positioned in the second direction DR2 of the fifth and sixth pixels PX5 and PX6. That is, the second ground line GNL2 may extend in the first direction DR1 and may be disposed between the third sub-display panel 103 and the first pixel PX1, between the third sub-display panel 103 and the second pixel PX2, between the third sub-display panel 103 and the sixth pixel PX5, and between the third sub-display panel 103 and the sixth pixel PX6.

The first connection line CL1 may be disposed between the first pixel PX1 and the fifth pixel PX5. For example, the first connection line CL1 may be adjacent to the fifth pixel PX5 in the first direction DR1. The second connection line CL2 may be disposed between the fifth pixel PX5 and the sixth pixel PX6. Each of the first and second connection lines CL1 and CL2 may extend in the second direction DR2.

For example, each of the first and second connection lines CL1 and CL2 may be disposed on the second insulating layer ILD2. That is, each of the first and second connection lines CL1 and CL2 may be disposed in a substantially same layer as the first ground line GNL1 and the dummy line DML. For example, the first connection line CL1, the second connection line CL2, the first ground line GNL1, and the dummy line DML may be formed simultaneously using a same material.

For example, the first and second connection lines CL1 and CL2 may overlap each of the first gate line GL1, the second gate line GL2, and the second ground line GNL2 in a plan view. For example, each of the first and second connection lines CL1 and CL2 may be perpendicular to each of the first gate line GL1, the second gate line GL2, and the second ground line GNL2 in a plan view.

As illustrated in FIG. 9, the second insulating layer ILD2 may be disposed between the first connection line CL1 and the second gate line GL2, and between the first connection line CL1 and the second ground line GNL2.

A second contact hole CNT2 may be formed in the second insulating layer ILD2 in a region where the first connection line CL1 and the first gate line GL1 overlap. Accordingly, the first connection line CL1 and the first gate line GL1 may contact each other, and may be electrically connected. Accordingly, the first connection line CL1 may transfer a first gate signal generated by the gate driver GDV to the first gate line GL1.

A contact hole may not be formed in the second insulating layer ILD2 in a region where the first connection line CL1 and the second gate line GL2 overlap, and a region where the first connection line CL1 and the second ground line GNL2 overlap. Accordingly, the first connection line CL1 may not contact each of the second gate line GL2 and the second ground line GNL2, and may not be electrically connected.

As illustrated in FIG. 10, the second insulating layer ILD2 may be disposed between the second connection line CL2 and the first gate line GL1, and between the second connection line CL2 and the second ground line GNL2.

A third contact hole CNT3 may be formed in the second insulating layer ILD2 in a region where the second connection line CL2 and the second gate line GL2 overlap. Accordingly, the second connection line CL2 and the second gate line GL2 may contact each other, and may be electrically connected. Accordingly, the second connection line CL2 may transfer a second gate signal generated by the gate driver GDV to the second gate line GL2.

A contact hole may not be formed in the second insulating layer ILD2 in a region where the second connection line CL2 and the first gate line GL1 overlap, and a region where the second connection line CL2 and the second ground line GNL2 overlap. Accordingly, the second connection line CL2 may not contact each of the first gate line GL1 and the second ground line GNL2, and may not be electrically connected.

Figure 11:
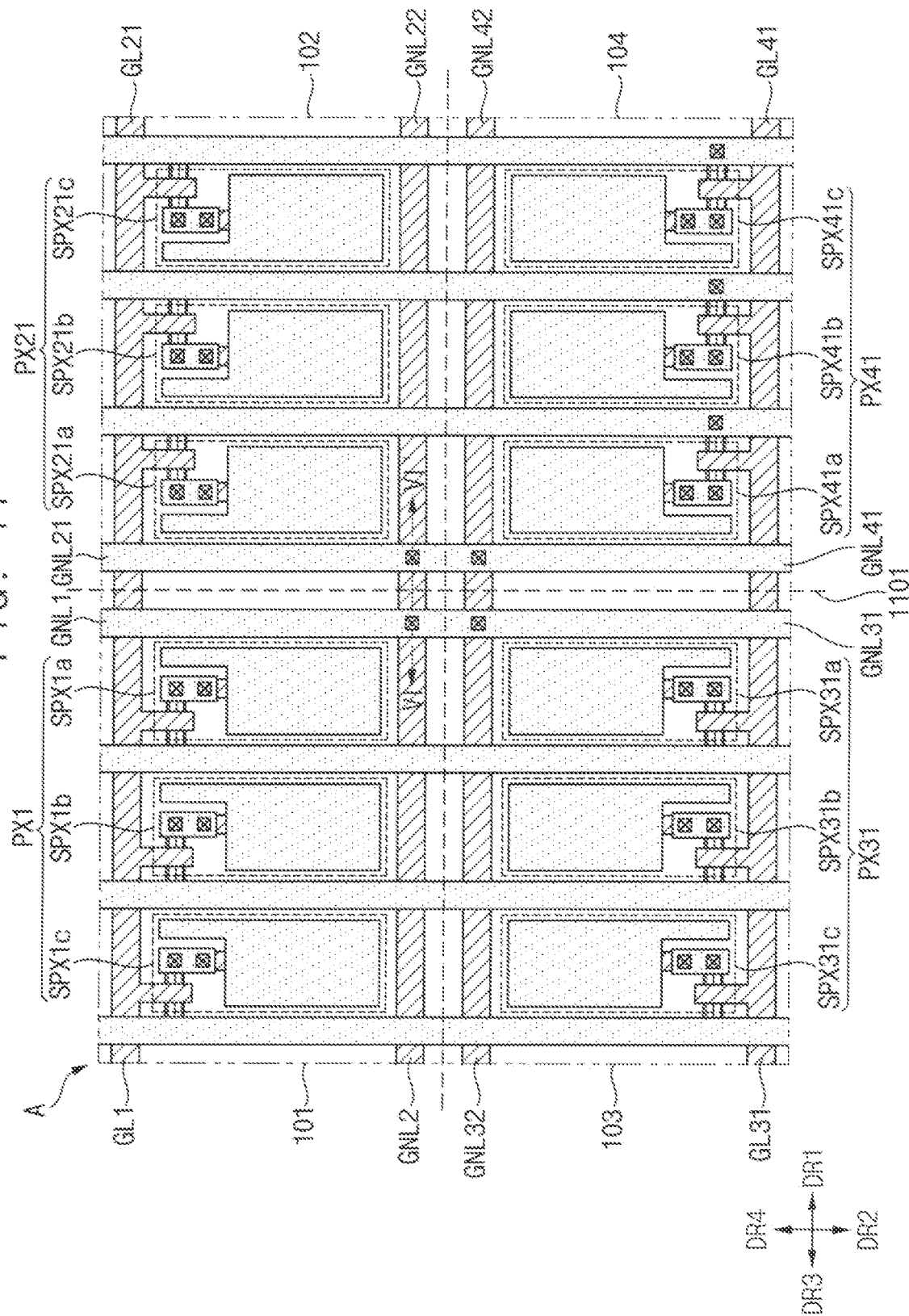
FIG. 11 is a layout view corresponding to an area "A" of FIG. 1.
Figure 12:
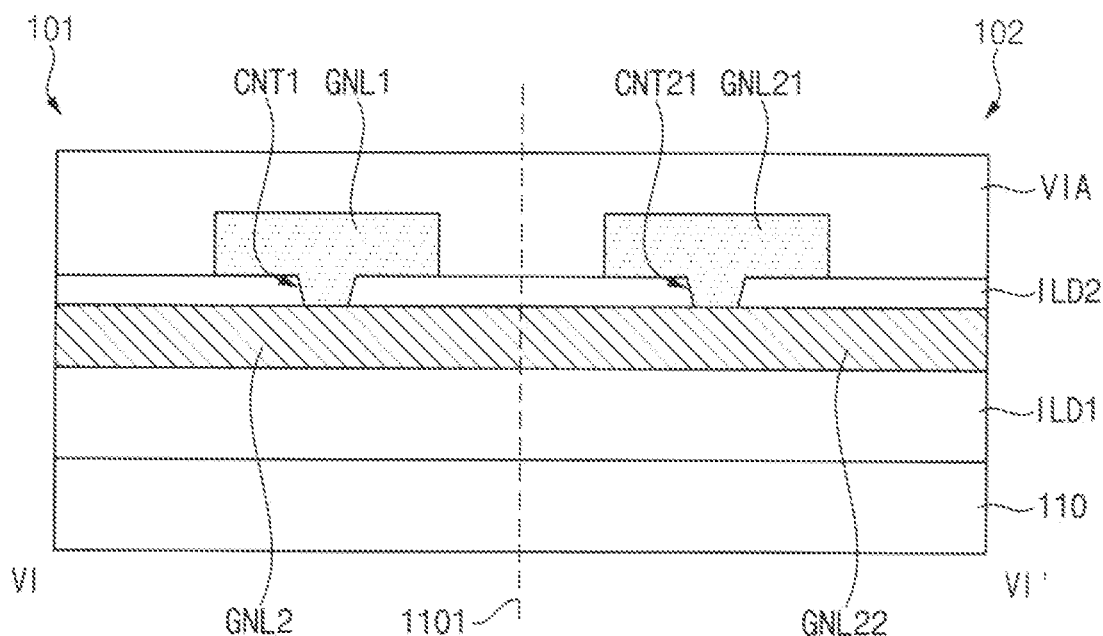
FIG. 12 is a cross-sectional view illustrating an example taken along a line VI-VI' of FIG. 11.
Figure 13:
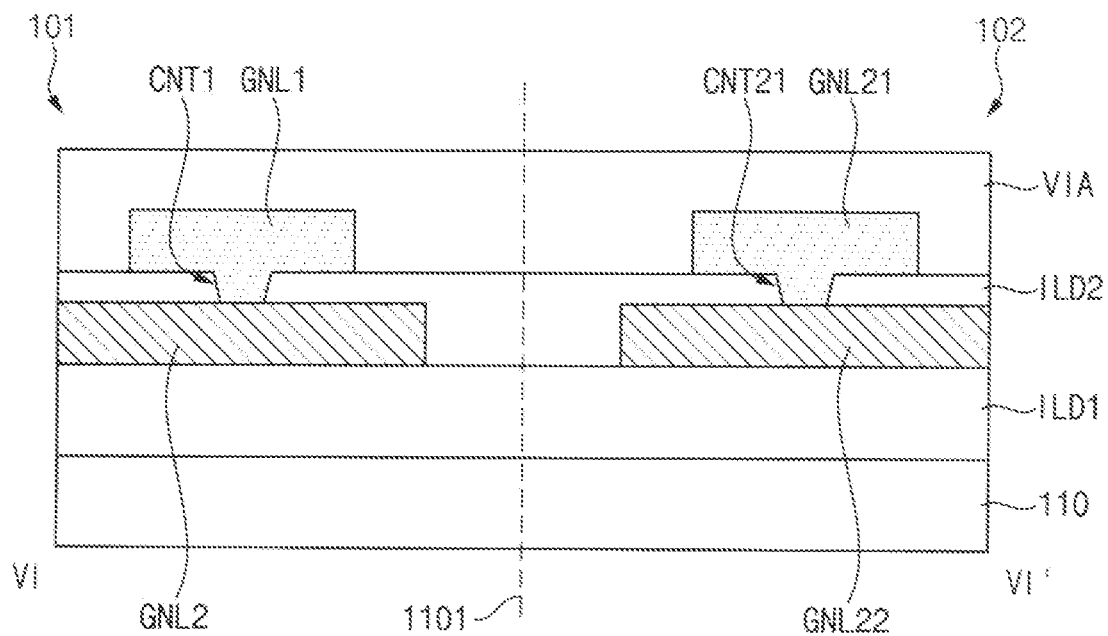
FIG. 13 is a cross-sectional view illustrating another example taken along the line VI-VI' of FIG. 11.
Figure 14:
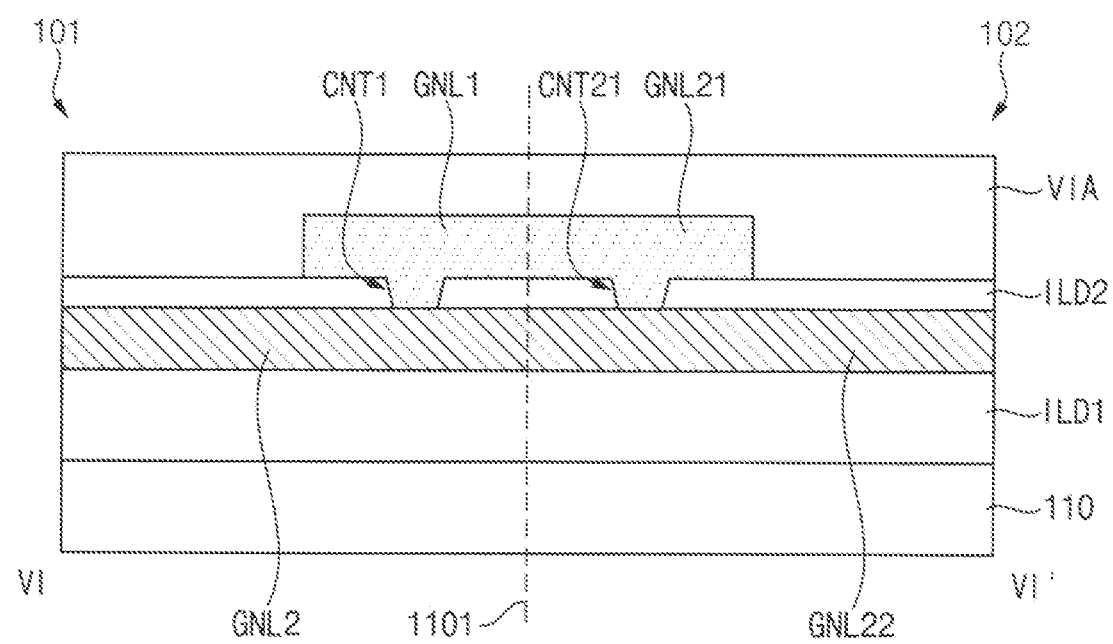
FIG. 14 is a cross-sectional view illustrating still another example taken along the line VI-VI' of FIG. 11.

FIG. 11 is a layout view corresponding to an area "A" of FIG. 1. FIG. 12 is a cross-sectional view illustrating an example taken along a line VI-VI' of FIG. 11. FIG. 13 is a cross-sectional view illustrating another example taken along the line VI-VI' of FIG. 11. FIG. 14 is a cross-sectional view illustrating still another example taken along the line VI-VI' of FIG. 11.

Referring to FIGS. 1, 11, 12, 13 and 14, the second sub-display panel 102 may include a twenty-first pixel PX21, the third sub-display panel 103 may include a thirty-first pixel PX31, and the fourth sub-display panel 104 may include a forty-first pixel PX41. The twenty-first pixel PX21 may be adjacent to the first sub-display panel 101 in the first direction DR1 and may be adjacent to the fourth sub-display panel 104 in the fourth direction DR4. The thirty-first pixel PX31 may be adjacent to the first sub-display panel 101 in the second direction DR2 and may be adjacent to the fourth sub-display panel 104 in the third direction DR3. The forty-first pixel PX41 may be adjacent to the second sub-display panel 102 in the second direction DR2 and may be adjacent to the third sub-display panel 103 in the first direction DR1. That is, each of the first, twenty-first, thirty-first, and forty-first pixels PX1, PX21, PX31, and PX41 may be positioned in a center of the display panel 100 (e.g. corners of each of the first to fourth sub-display panels 101, 102, 103 and 104).

In an embodiment, as illustrated in FIG. 11, the first and second sub-display panels, 101 and 102, may be symmetrical to each other with respect to a dividing plane 1101. That is, the first pixel PX1 and the twenty-first pixel PX21 may be symmetrical to each other with respect to the dividing plane 1101, the first ground line GNL1 and a twenty-first ground line GNL21 may be symmetrical to each other with respect to the dividing plane 1101, the second ground line GNL2 and a twenty-second ground line GNL22 may be symmetrical to each other with respect to the dividing plane 1101, and the first gate line GL1 and a twenty-first gate line GL21 may be symmetrical to each other with respect to the dividing plane 1101. Similarly, the first and third sub-display panels 101 and 103 may be symmetrical to each other, the second and fourth sub-display panels 102 and 104 may be symmetrical to each other, and the third and fourth sub-display panels 103 and 104 may be symmetrical to each other.

For example, as illustrated in FIG. 12, the first and twenty-first ground lines GNL1 and GNL21 extending in the second direction DR2 may be spaced apart from each other in the first direction DR1. The second and twenty-second ground lines GNL2 and GNL22 extending in the first direction DR1 may contact each other at the dividing plane 1101. For example, although not illustrated in the drawing, a conductive film may be disposed between the second ground line GNL2 and the twenty-second ground line GNL22, and may electrically connect the second ground line GNL2 and the twenty-second ground line GNL22.

For another example, as illustrated in FIG. 13, the first and twenty-first ground lines GNL1 and GNL21 may be spaced apart from each other in the first direction DR1. The second and twenty-second ground lines GNL2 and GNL22 may be spaced apart from each other in the second direction DR2.

For still another example, as illustrated in FIG. 14, the first and twenty-first ground lines GNL1 and GNL21 may contact each other. The second and twenty-second ground lines GNL2 and GNL22 may contact each other.

According to the display device 10 according to embodiments, the first lines may be disposed in each of the sub-display panels 101, 102, 103 and 104 to correspond to the pixel columns, respectively. Two first lines positioned at the outermost (e.g. left and right) among the first lines may be used as the first ground lines GNL1, and remaining first lines may be used as the connection lines CL or the dummy lines DML. Accordingly, a pitch between the first pixel PX1 and the twenty-first pixel PX21 and a pitch between the first pixel PX1 and the second pixel PX2 may be substantially the same or similar.

Although certain embodiments have been described herein, various modifications and similar arrangements of such embodiments will be apparent from this description. Accordingly, the inventive concepts are not limited to such embodiments, but rather to the scope of the appended claims.

What is claimed is:

1. A display device comprising:
a first sub-display panel; and
a second sub-display panel adjacent to the first sub-display panel in a first direction,
wherein the first sub-display panel includes:
a first pixel adjacent to the second sub-display panel; and
a first ground line disposed between the first pixel and the second sub-display panel and extending in a second direction crossing the first direction, and
wherein the second sub-display panel includes:
a second pixel adjacent to the first sub-display panel; and
a second ground line disposed between the second pixel and the first sub-display panel and extending in the second direction, and
wherein the first and second pixels each include a light emitting diode.

2. The display device of claim 1, wherein the first ground line and the second ground line are adjacent to each other.

3. The display device of claim 1, further comprising a third sub-display panel adjacent to the first sub-display panel in the second direction,
wherein the first sub-display panel further includes a third ground line disposed between the first pixel and the third sub-display panel and extending in the first direction.

4. The display device of claim 3, wherein the first pixel is adjacent to the third sub-display panel.

5. The display device of claim 3, wherein the first ground line and the third ground line are perpendicular to each other.

6. The display device of claim 3, wherein a portion of the first ground line overlaps a portion of the third ground line.

7. The display device of claim 6, wherein the first and third ground lines are electrically connected through a contact hole at a portion where the first and third ground lines overlap each other.

8. The display device of claim 3, wherein the first sub-display panel further includes a gate line extending in the first direction and electrically connected to the first pixel.

9. The display device of claim 8, wherein the first ground line crosses the gate line.

10. The display device of claim 8, wherein the first sub-display panel further includes:
- a third pixel adjacent to the first pixel, spaced apart from the second sub-display panel by the first pixel, and electrically connected to the gate line; and
- a dummy line disposed between the first pixel and the third pixel and extending in the second direction.

11. The display device of claim 10, wherein the dummy line crosses the gate line.

12. The display device of claim 10, wherein the dummy line includes a same material as the first ground line.

13. The display device of claim 8, wherein the first sub-display panel further includes:
- a fourth pixel spaced apart from the first pixel in a third direction opposite to the first direction and electrically connected to the gate line; and
- a connection line disposed between the first pixel and the fourth pixel, extending in the second direction, and electrically connected to the gate line.

14. The display device of claim 13, wherein the connection line includes a same material as the first ground line.

15. The display device of claim 8, wherein the first sub-display panel further includes:
- a substrate;
- a first insulating layer disposed on the substrate;
- a gate electrode disposed on the first insulating layer;
- a second insulating layer covering the gate electrode; and
- a connection electrode disposed on the second insulating layer,
- wherein the first ground line and the connection electrode are disposed in a first ground-line layer.

16. The display device of claim 15, wherein the third ground line and the gate electrode are disposed in a third ground-line layer.

17. The display device of claim 15, wherein the gate line and the gate electrode are disposed in a gate-line layer.

18. The display device of claim 1, wherein the first ground line contacts the second ground line.

19. The display device of claim 1, wherein the first ground line is spaced apart from the second ground line.

20. The display device of claim 1, wherein the first and second ground lines protect the first and second pixels from static electricity.

* * * * *